(12) United States Patent
Yin et al.

(10) Patent No.: US 10,665,689 B2
(45) Date of Patent: May 26, 2020

(54) PREPARATION METHOD FOR PLATFORM-SHAPED ACTIVE REGION BASED P-I-N DIODE STRING IN RECONFIGURABLE LOOP ANTENNA

(71) Applicant: Xi'an Creation Keji Co., Ltd., Xi'an (CN)

(72) Inventors: Xiaoxue Yin, Xi'an (CN); Liang Zhang, Xi'an (CN)

(73) Assignee: XI'AN CREATION KEJI CO., LTD., Xi'an (CN)

( * ) Notice: Subject to any disclaimer, the term of this patent is extended or adjusted under 35 U.S.C. 154(b) by 120 days.

(21) Appl. No.: 15/854,054

(22) Filed: Dec. 26, 2017

(65) Prior Publication Data
US 2018/0175160 A1    Jun. 21, 2018

Related U.S. Application Data

(63) Continuation of application No. PCT/CN2017/115358, filed on Dec. 9, 2017.

(30) Foreign Application Priority Data

Dec. 20, 2016 (CN) .......................... 2016 1 1184336

(51) Int. Cl.
*H01L 29/66* (2006.01)
*H01L 21/285* (2006.01)
(Continued)

(52) U.S. Cl.
CPC ...... *H01L 29/6609* (2013.01); *H01L 21/0262* (2013.01); *H01L 21/0274* (2013.01); *H01L 21/02238* (2013.01); *H01L 21/02271* (2013.01); *H01L 21/02532* (2013.01); *H01L 21/02595* (2013.01); *H01L 21/28518* (2013.01); *H01L 21/3065* (2013.01); *H01L 21/30604* (2013.01); *H01L 21/31111* (2013.01); *H01L 21/324* (2013.01); *H01L 21/76895* (2013.01); *H01L 21/84* (2013.01); *H01L 29/868* (2013.01);
(Continued)

(58) Field of Classification Search
CPC . H01Q 5/40; H01Q 23/00; H01Q 7/00; H01L 21/02532; H01L 29/868
See application file for complete search history.

(56) References Cited

U.S. PATENT DOCUMENTS

| | | | |
|---|---|---|---|
| 2006/0194357 A1* | 8/2006 | Hsu | .......... C30B 19/00 438/28 |
| 2008/0099881 A1* | 5/2008 | Jung | .......... H01L 27/0676 257/601 |
| 2009/0128428 A1* | 5/2009 | Ishizuka | .......... H01Q 1/243 343/702 |

* cited by examiner

*Primary Examiner* — Mohammed R Alam
(74) *Attorney, Agent, or Firm* — Hemisphere Law, PLLC; Zhigang Ma

(57) ABSTRACT

A preparation method for a platform-shaped active region based P-I-N diode string in a reconfigurable loop antenna includes: (a) selecting an SOI substrate; (b) etching the SOI substrate to form a platform-shaped active region; (c) depositing a P-type Si material and an N-type Si material around the platform-shaped active region by an in-situ doping process to form a P region and an N region respectively; (d) depositing a polysilicon material around the platform-shaped active region; (e) forming leads on a surface of the polysilicon material and forming PADs by photolithography, to form the P-I-N diode string. Therefore, a high-performance platform-shaped active region based P-I-N diode string suitable for a solid-state plasma antenna can be provided by an in-situ doping process.

10 Claims, 15 Drawing Sheets

(51) Int. Cl.
*H01L 21/3065* (2006.01)
*H01L 29/868* (2006.01)
*H01Q 7/00* (2006.01)
*H01Q 23/00* (2006.01)
*H01L 21/84* (2006.01)
*H01L 21/306* (2006.01)
*H01L 21/02* (2006.01)
*H01L 21/324* (2006.01)
*H01L 21/027* (2006.01)
*H01L 21/311* (2006.01)
*H01L 21/768* (2006.01)
*H01Q 5/40* (2015.01)
*H01Q 3/24* (2006.01)
*H01Q 1/22* (2006.01)

(52) U.S. Cl.
CPC ................ *H01Q 3/24* (2013.01); *H01Q 5/40* (2015.01); *H01Q 7/00* (2013.01); *H01Q 23/00* (2013.01); *H01Q 1/2283* (2013.01)

PREPARATION METHOD FOR PLATFORM-SHAPED ACTIVE REGION BASED P-I-N DIODE STRING IN RECONFIGURABLE LOOP ANTENNA

FIELD OF THE DISCLOSURE

The disclosure relates to the field of manufacturing technologies of semiconductor devices, and more particularly to a preparation method for a platform-shaped active region based P-I-N diode string in a reconfigurable loop antenna.

BACKGROUND

A traditional metal antenna is relatively large in both weight and volume, and thus inflexible to design and manufacture and relatively poor in self-reconfigurability and adaptation, which severely restricts further the improvement of development and performances of radar and communication systems. Therefore, in recent years, research theories on broadband and miniaturization as well as reconfiguration and multiplexing of the antenna tend to be active day by day.

Under such background, researchers put forward a novel antenna concept, i.e., a plasma antenna, and such antenna is a radiofrequency antenna taking plasma as an electromagnetic radiation and guiding it to medium. An instant bandwidth of the plasma antenna can be changed by changing a plasma concentration and the plasma antenna has large dynamic range. Dynamic parameters such as frequency, beam width, power, gain and directivity of the antenna can be adjusted by changing resonance, impedance, density and so on of the plasma. In addition, in an unactivated state of the plasma antenna, a radar scattering section can be ignored, and the antenna is only activated in a short time of communication sending or receiving, and disguise performance of the antenna is improved. These properties, can be broadly applied to fields such as various scout, early warning, and confrontation radars, satellite-borne, onboard and missile antennas, microwave imaging, antennas, and high signal-to-noise microwave communication antennas, thereby greatly attracting attention of researchers at domestic and foreign and becoming a hot spot in the field of antenna research.

However, most current research is limited to a gaseous plasma antenna, and it is nearly blank in research on a solid-state plasma antenna. But the solid-state plasma generally exists in semiconductor devices and does not need to be wrapped by a dielectric tube like the gaseous plasma, and has better safety and stability. It is found after theoretical research that when a DC bias voltage is applied to a P-I-N diode, a DC current will form the solid-state plasma consisting of free carriers (electrons and holes) on the surface. Such plasma has metal-like characteristics, that is, a reflection action for electromagnetic waves, and the reflection characteristic is closely related to microwave transmission characteristics, concentration and distribution of the surface plasma.

Therefore, how to manufacture a P-I-N diode to apply into a reconfigurable loop antenna becomes very important.

SUMMARY

Therefore, in order to solve the technical defects and deficiencies of the prior art, the disclosure provides a preparation method for a platform-shaped active region based P-I-N diode string in a reconfigurable loop antenna.

Specifically, an embodiment of the disclosure provides a preparation method for a platform-shaped active region based P-I-N diode string in a reconfigurable loop antenna. The P-I-N diode string is configured (i.e., structured and arranged) for manufacturing the reconfigurable loop antenna. The loop antenna includes: a semiconductor substrate (1); a dielectric plate (2); a first P-I-N diode ring (3), a second P-I-N diode ring (4), first direct current (DC) bias wires (5) and second DC bias wires (6), all disposed on the semiconductor substrate (1); and a coupling type feed source (7), disposed on the dielectric plate (2). The preparation method includes steps of:

(a) selecting a silicon-on-insulator (SOI) substrate;
(b) etching the SOI substrate to form a platform-shaped active region;
(c) depositing a P-type silicon material and an N-type silicon material around the platform-shaped active region by an in-situ, doping process to form a P region and an N region respectively;
(d) depositing a polysilicon material around the platform-shaped active region by a chemical vapor deposition (CVD) process;
(e) depositing a fourth protective layer on a surface of the SOI substrate by a CVD process;
(f) activating impurities in the P region and N region by an annealing process; and
(g) forming leads on a surface of the polysilicon material and forming PADs by photolithography, to obtain the P-I-N diode string.

In an embodiment of the disclosure, the step (b) includes:
(b1) forming a first protective layer on a surface of the SOI substrate by a CVD process;
(b2) forming an active region pattern on the first protective layer by a photolithography process using a first mask;
(b3) etching the first protective layer and a top silicon layer of the SOI substrate in designated positions around the active region pattern by a dry etching process.

In an embodiment of the disclosure, after the step (b), the preparation method further includes:
(x1) oxidizing sidewalls of the platform-shaped active region, by an oxidizing process to form an oxide layer on the sidewalls of the platform-shaped active region; and
(x2) etching off the oxide layer by a wet etching process to planarize the sidewalls of the platform-shaped active region.

In an embodiment of the disclosure, the step (c) includes:
(c1) depositing a second protective layer on a surface of the SOI substrate;
(c2) forming a P region pattern on a surface of the second protective layer by a photolithography process using a second mask;
(c3) removing the second protective layer on the P region pattern by a wet etching process;
(c4) depositing the P-type silicon material on a sidewall of the platform-shaped active region to form the P region by the in-situ doping process;
(c5) depositing a third protective layer on a surface of the SOI substrate;
(c6) forming an N region pattern on a surface of the third protective layer by a photolithography process using a third mask;
(c7) removing the third protective layer on the N region pattern by a wet etching process; and
(c8) depositing the N-type silicon material on another sidewall of the platform-shaped, active region to form the N region by the in-situ doping process.

In an embodiment of the disclosure, the step (c4) includes:

(c41) depositing the P-type silicon material on the sidewall of the platform-shaped active region by the in-situ doping process;

(c42) etching the P-type silicon material by a dry etching process using a fourth mask to form the P region on the sidewall of the platform-shaped active region; and (c43) removing the second protective layer on the surface of the SOI substrate by a selective etching process.

In an embodiment of the disclosure, the step (c8) includes:

(c81) depositing the N-type Si material on the another sidewall of the platform-shaped active region by the in-situ doping process;

(c82) etching the N-type silicon material by a dry etching process using a fifth mask to form the N region on the another sidewall of the platform-shaped active region; and (c83) removing the third protective layer on the surface of the SOI substrate by a selective etching process.

In an embodiment of the disclosure, the step (g) includes:

(g1) forming a lead hole pattern on a surface of the fourth protective layer by a photolithography process using a sixth mask;

(g2) etching the fourth protective layer to expose a part of the polysilicon material by an anisotropic etching process to form the lead holes;

(g3) sputtering a metal material into the lead holes to form a metal silicide; and (g4) performing a passivation treatment, forming PADs by photolithography and performing an interconnection, to obtain the P-I-N diode string.

In an embodiment of the disclosure, the first plasma P-I-N diode ring (3) includes a first plasma P-I-N diode string (8), the second plasma P-I-N diode ring (4) includes a second plasma P-I-N diode string (9), and a perimeter of each of the first plasma P-I-N diode ring (3) and the second plasma P-I-N diode ring (4) is equal to an electromagnetic wavelength of a signal to be received.

In an embodiment of the disclosure, the first DC bias wires (5) are disposed on two ends of the first plasma P-I-N diode string (8), the second DC bias wires (6) are disposed on two ends of the second plasma P-I-N diode string (9), and the first DC bias wires (5) and the second DC bias wires (6) are formed on the semiconductor substrate (1) by a heavily doped polysilicon.

In an embodiment of the disclosure, the coupling type feed source (7) is mounted on the dielectric plate (2); the dielectric plate (2) is provided with a metal microstrip patch (10) on an upper surface and a metal grounding plate (11) on a lower surface; and the metal microstrip patch (10) includes a main branch (12), first sub-branches (13) and second sub-branches (14).

Sum up, adverse effects caused by the ion implantation manner can be avoided by adopting the in-situ doping in the embodiments of the disclosure, and the doping concentration of a material can be controlled by controlling a gas flow, and it is favorable for obtaining a steep doping interface, thereby obtaining better device performances. The P-I-N diode plasma reconfigurable antenna may be composed of SOI based PIN diodes arranged in an array, by use of selective conductions of the P-I-N diodes in the array through an external control, the array would form dynamic solid-state plasma stripes and thus achieve the function of antenna and have transmitting and receiving functions for specific electromagnetic waves. Moreover, the antenna can change the solid-state plasma stripes in shape and distribution by use of selective conductions of the P-I-N diodes in the array and thereby realize the reconstruction of antenna, so that has important application prospects in the defense communications and radar technologies.

Other aspects and features of the disclosure will become apparent from the following detailed description with reference to the attached drawings. It should be understood, however, that the drawings are designed solely for the purpose of illustration and not as a definition of the limits of the disclosure, for which reference should be made to the appended claims. It should also be understood that, unless otherwise indicated, it is not necessary to scale the drawings, and they simply try to conceptually explain the structures and processes described herein.

BRIEF DESCRIPTION OF THE DRAWINGS

Specific embodiments of the disclosure are explained in detail with reference to accompanying drawings.

DETAILED DESCRIPTION OF PREFERRED EMBODIMENTS

Figure 1:
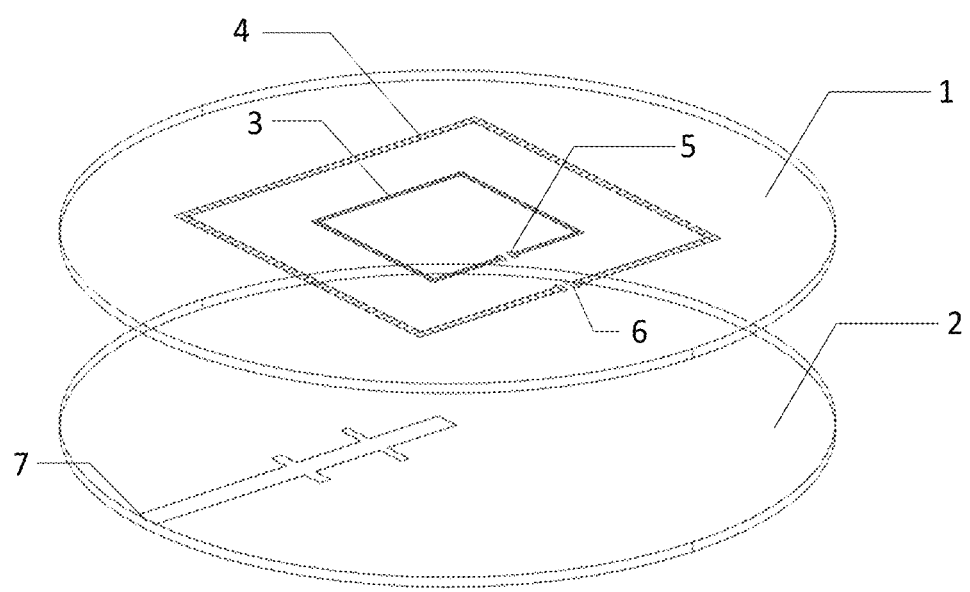
FIG. 1 is a structural schematic view of a reconfigurable loop antenna according to an embodiment of the disclosure.

In order to make the objectives, features and advantages of the disclosure more apparent and easy to understand, specific embodiments of the disclosure are explained in detail with reference to accompanying drawings.

The disclosure provides a preparation method for a platform-shaped active region based P-I-N diode suitable for forming a reconfigurable loop antenna. The P-I-N diode may be a transverse P-I-N diode formed based on a silicon-on-insulator (SOI), and when a DC bias voltage is applied, a DC current will form solid-state plasma consisting of free carriers (electrons and holes) on the surface. The plasma has metal-like characteristics, that is, a reflection action for electromagnetic waves, and the reflection characteristic is closely related to microwave transmission characteristics, concentration and distribution of the surface plasma.

In the following, a preparation method for a platform-shaped active region based P-I-N diode string in a reconfigurable loop antenna prepared by the disclosure will be further described in detail. In the drawings, for the purpose of convenient explanation, the thicknesses of layers and regions are zoomed in or out, and the shown sizes do not represent actual sizes.

Figure 2:
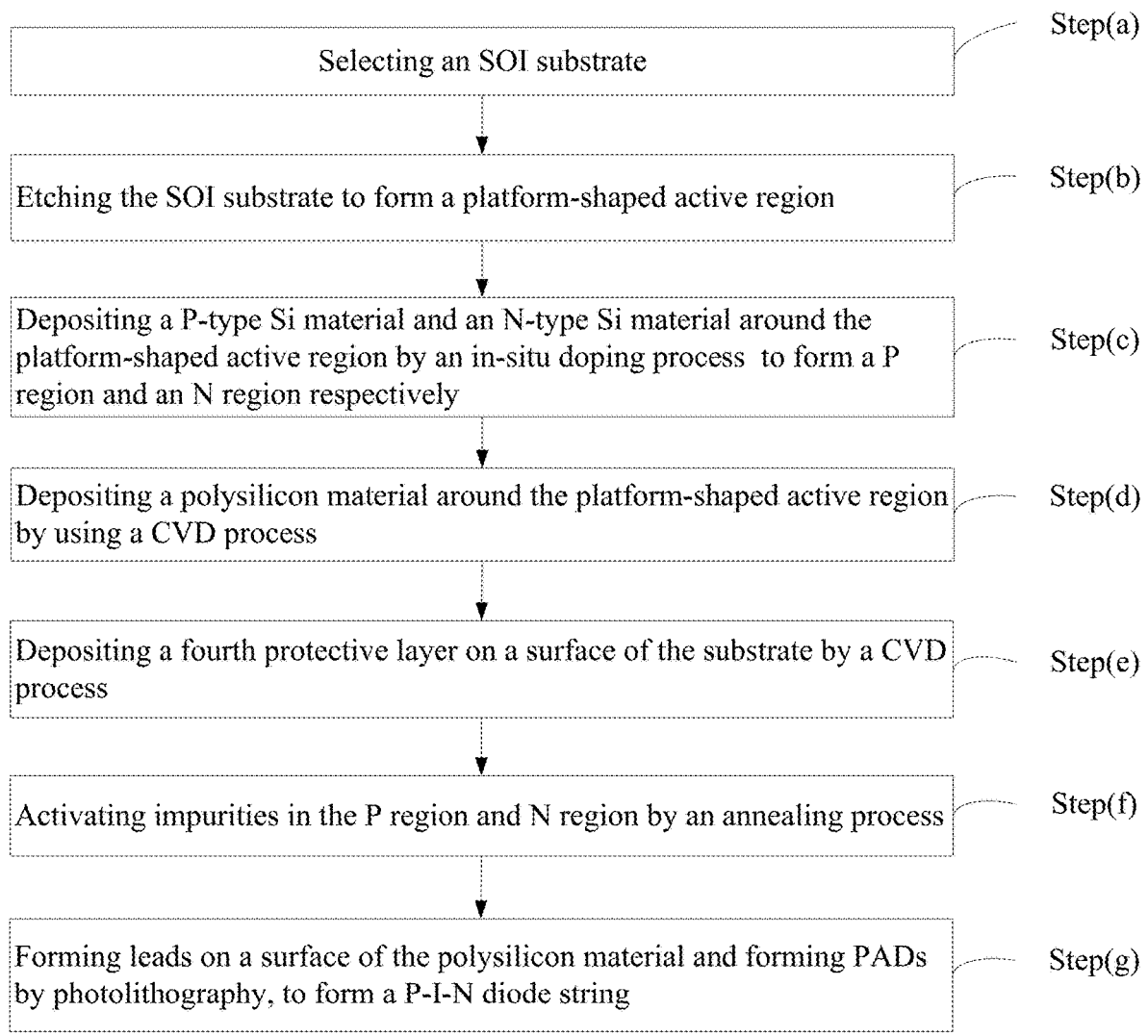
FIG. 2 is a flowchart of a preparation method for a platform-shaped active region based P-I-N diode string in a reconfigurable loop antenna according to an embodiment of the disclosure.
Figure 3:
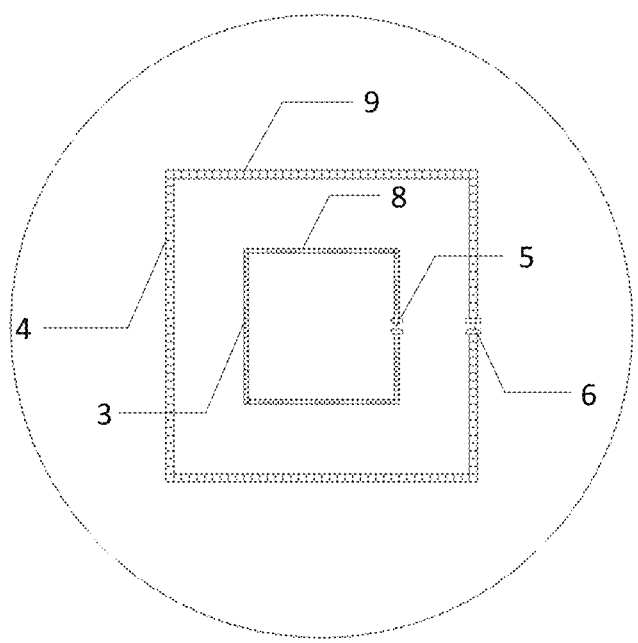
FIG. 3 is a structural schematic view of a semiconductor substrate of a reconfigurable loop antenna provided by an embodiment of the disclosure.
Figure 4:
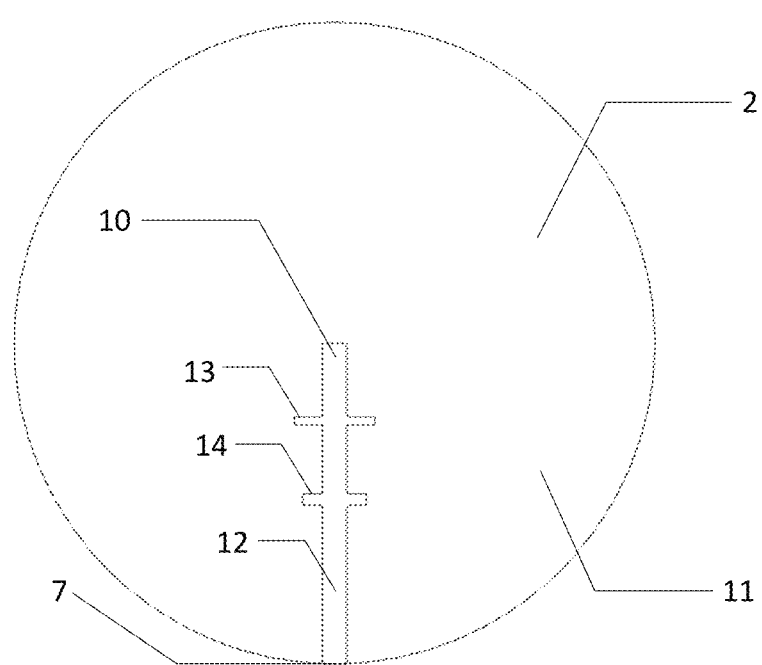
FIG. 4 is a structural schematic view of a dielectric plate of a loop antenna provided by an embodiment of the disclosure.
Figure 5:
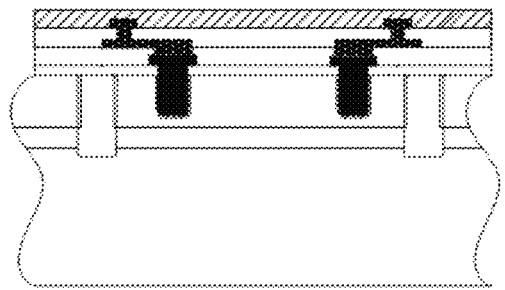
FIG. 5 is a structural schematic view of a P-I-N diode in a reconfigurable loop antenna provided by an embodiment of the disclosure.
Figure 6:
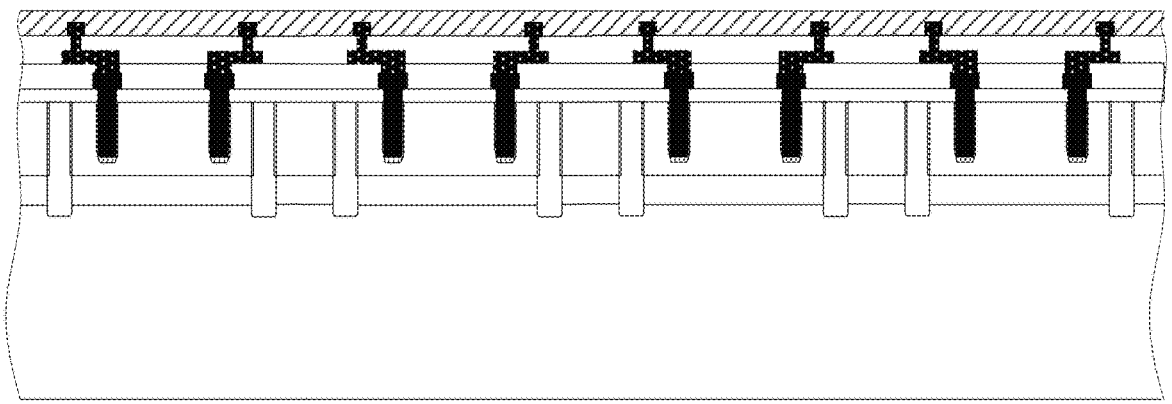
FIG. 6 is a structural schematic view of a P-I-N diode string in a reconfigurable loop antenna provided by an embodiment of the disclosure.

Referring to FIG. 2, and FIG. 2 is a flowchart of a preparation method for a platform-shaped active region based P-I-N diode string in a reconfigurable loop antenna according to an embodiment of the disclosure. The method is suitable for preparing an SOI-based transverse P-I-N diode, and the platform-shaped active region based P-I-N diode is mainly used for manufacturing the reconfigurable loop antenna. The method includes following steps of:

(a) selecting an SOI substrate;

in particular, for the step (a), the cause of adopting the SOI substrate is that a good microwave characteristic is required for the solid-state plasma antenna, while in order to meet this requirement, the P-I-N diode needs to possess good isolation characteristic and limiting capacity for carriers, i.e., the solid-state plasma; and $SiO_2$ can limit the carriers, i.e., the solid-state plasma within a top silicon layer, and thus the SOI is preferably adopted as a substrate of the solid-state plasma P-I-N diode;

(b) etching the SOI substrate to form a platform-shaped active region;

(c) depositing a P-type Si (silicon) material and an N-type Si material around the platform-shaped active region by an in-situ doping process to form a P region and an N region respectively;

(d) depositing a polysilicon (Poly-Si) material around the platform-shaped active region by a chemical vapor deposition (CVD) process;

(e) depositing a fourth protective layer on an entire surface of the substrate by a CVD process;

(f) activating impurities in the P region and N region by an annealing process; and (g) forming leads on a surface of the polysilicon material and forming PADs by photolithography, to form the P-I-N diode string.

In an embodiment of the disclosure, the step (b) includes:

(b1) forming a first protective layer on a surface of the SOI substrate by a CVD process;

(b2) using a photolithography process with a first mask to form an active region pattern on the first protective layer; and (b3) etching the first protective layer and the top Si layer of the SOI substrate in designated positions around the active region pattern by a dry etching process.

In an embodiment of the disclosure, after the step (b), the method further includes:

(x1) oxidizing sidewalls of the platform-shaped active region by an oxidizing process to form an oxide layer on the sidewalls of the platform-shaped active region; and (x2) etching the oxide layer by a wet etching process to planarize the sidewalls of the platform shaped active region.

The benefits of the steps (x1) and (x2) are to prevent protrusions on the sidewalls of trenches from forming an electric field concentrated region and prevent from causing breakdown of the P-i and N-i junctions.

In an embodiment of the disclosure, the step (c) includes:

(c1) depositing a second protective layer on an entire surface of the substrate;

(c2) forming a P region pattern on a surface of the second protective layer by a photolithography process with a second mask;

(c3) removing the second protective layer on the P region pattern by a wet etching process;

(c4) depositing the P-type Si material on a sidewall of the platform-shaped active region to faun the P region by the in-situ doping process;

(c5) depositing a third protective layer on an entire surface of the substrate;

(c6) forming an N region pattern on a surface of the third protective layer by a photolithography process with a third mask;

(c7) removing the third protective layer on the N region pattern by a wet etching process; and (c8) depositing the N-type Si material on another sidewall of the platform-shaped active region to form the N region by the in-situ doping process.

It should be noted that in a conventional preparation process for the P region and the N region of the P-I-N diode, an implantation process is adopted for the formations of the P and N regions, but such conventional method requires larger implantation dosage and energy, has high requirements on equipment and is incompatible with the existing process. However, if a diffusion process is adopted, a junction depth is deeper, but the P region and N region have larger areas, resulting in a low integration level and an uneven doping concentration, thereby affecting electrical properties of the P-I-N diode and leading to poor controllability in concentration and distribution of the solid-state plasma.

Adverse effects caused by the ion implantation manner can be avoided by adopting the in-situ doping, and the doping concentration of a material can be controlled by controlling a gas flow, and it is favorable for obtaining a steep doping interface, thereby obtaining better device performances.

In an embodiment of the disclosure, the step (c4) includes:

(c41) depositing the P-type Si material on the sidewall of the platform-shaped active region by the in-situ doping process;

(c42) etching the P-type Si material by a dry etching process with a fourth mask to form the P region on the sidewall of the platform-shaped active region; and (c43) removing the second protective layer on an entire surface of the substrate by a selective etching process.

In an embodiment of the disclosure, the step (c8) includes:

(c81) depositing the N-type Si material the another sidewall of the platform-shaped active region by the in-situ doping process;

(c82) etching the N-type Si material by a dry etching process with a fifth mask to form the N region on the another sidewall of the platform-shaped active region; and (c83) removing the third protective layer on an entire surface of the substrate by a selective etching process.

In an embodiment of the disclosure, the step (g) includes:

(g1) forming a lead hole pattern on a surface of the fourth protective layer by a photolithography process with a sixth mask;

(g2) etching the fourth protective layer to expose a part of the polysilicon material by an anisotropic etching process to form the lead holes;

(g3) sputtering a metal material into the lead holes to form a metal silicide; and (g4) performing a passivation treatment, forming PADs by photolithography and performing an interconnection, to thereby obtain the P-I-N diode string.

The embodiment of the disclosure uses the in-situ doping process to prepare and provide the high-performance platform-shaped active region based P-I-N diode suitable for forming a solid-state plasma antenna.

Figure 7A:
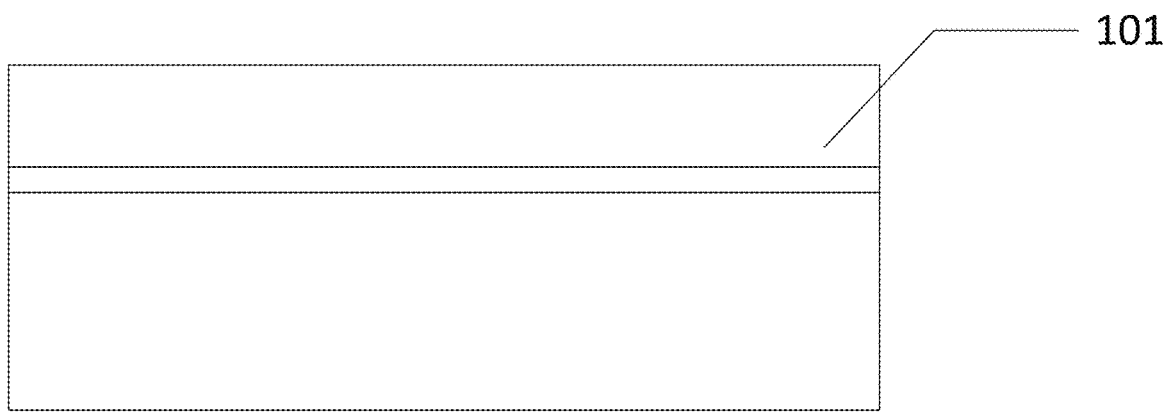
FIGS. 7A to 7S are schematic views of another preparation method for a platform-shaped active region based P-I-N diode in a reconfigurable loop antenna according to an embodiment of the disclosure.
Figure 7B:
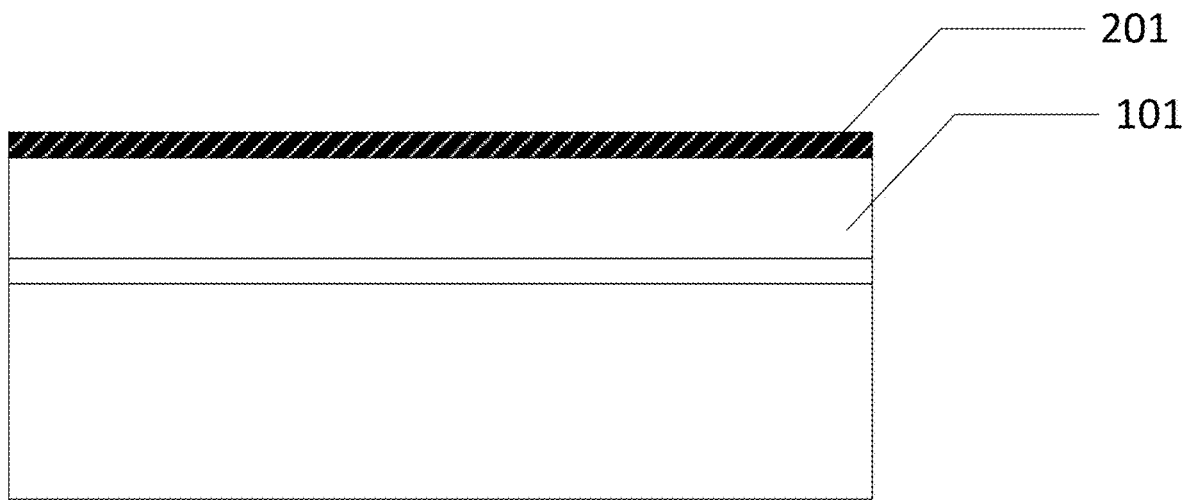
Figures 1, 7C:
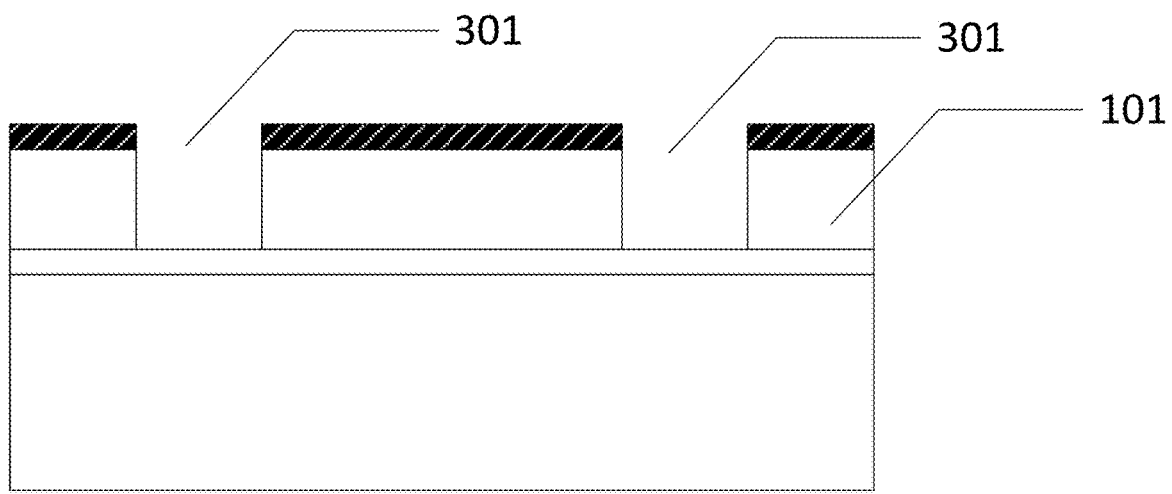
Figures 2, 7C:
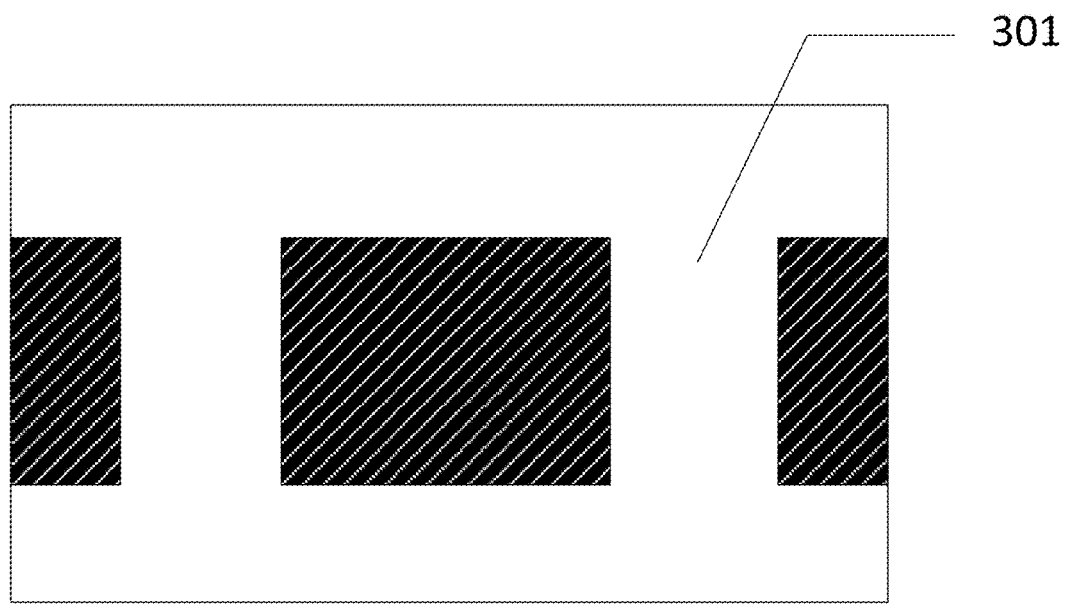
Figures 1, 7D:
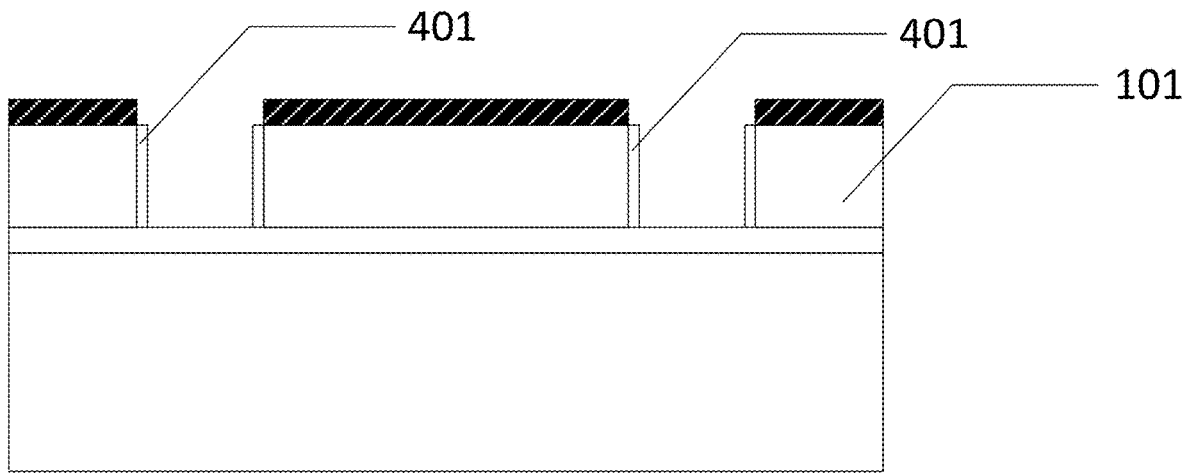
Figures 2, 7D:
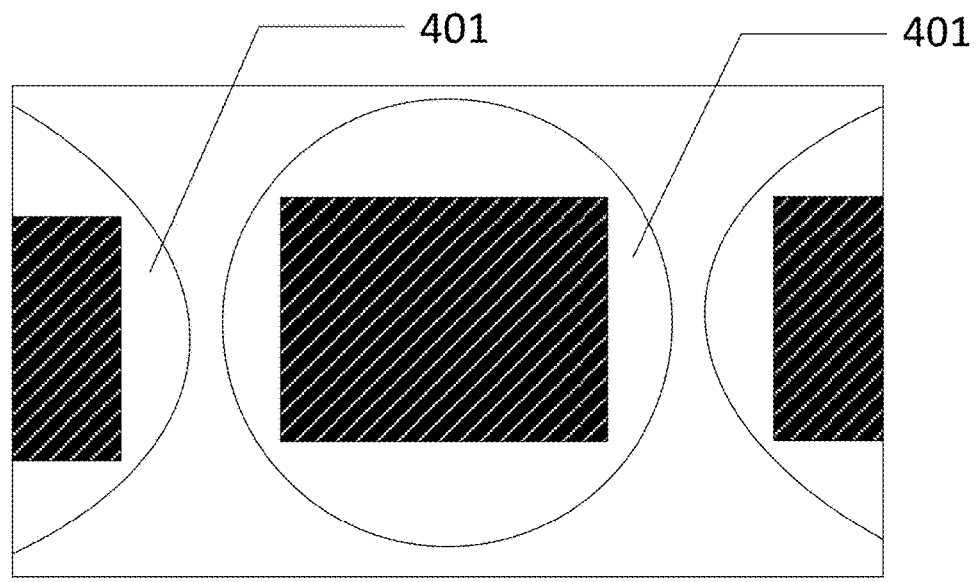
Figures 1, 7E:
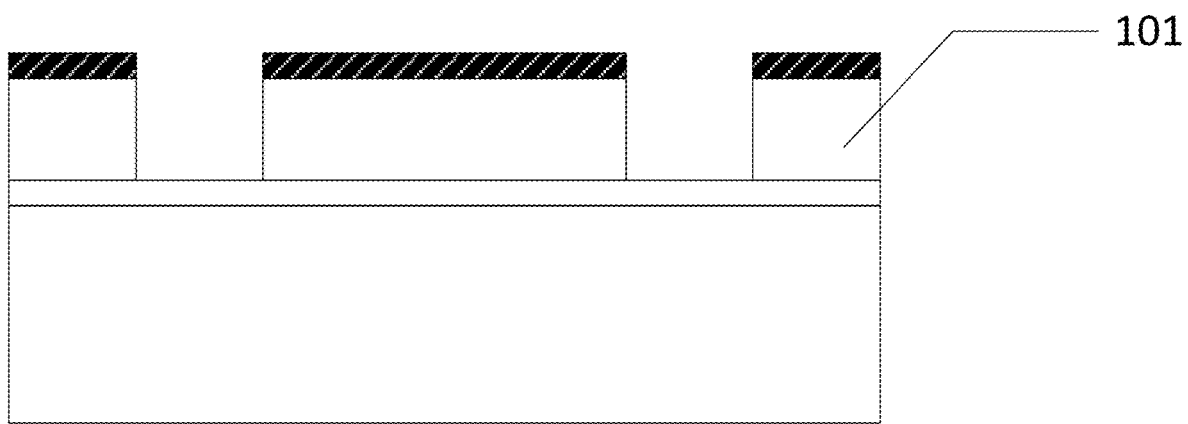
Figures 2, 7E:
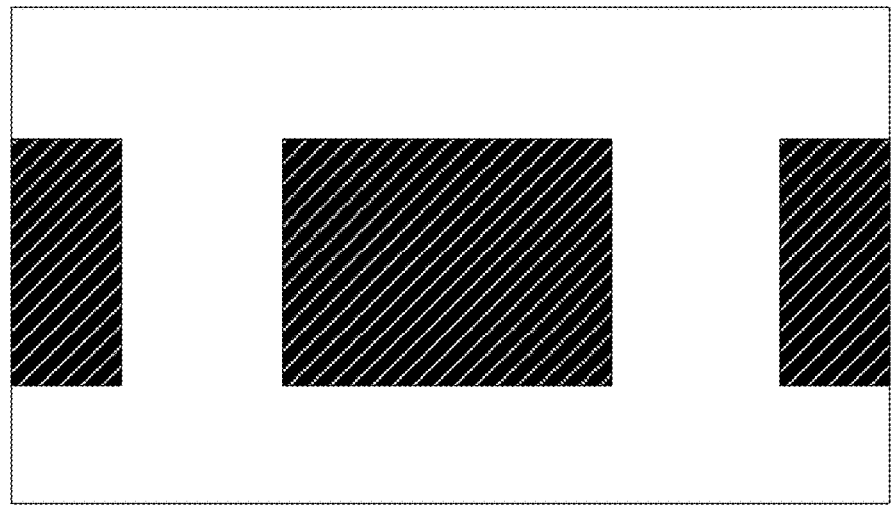
Figure 7F:
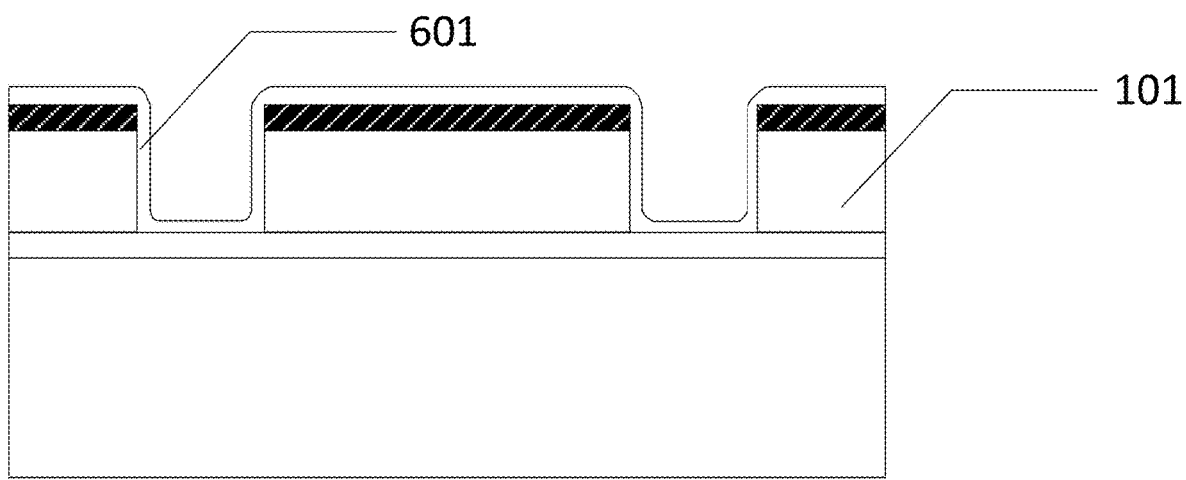
Figure 7G:
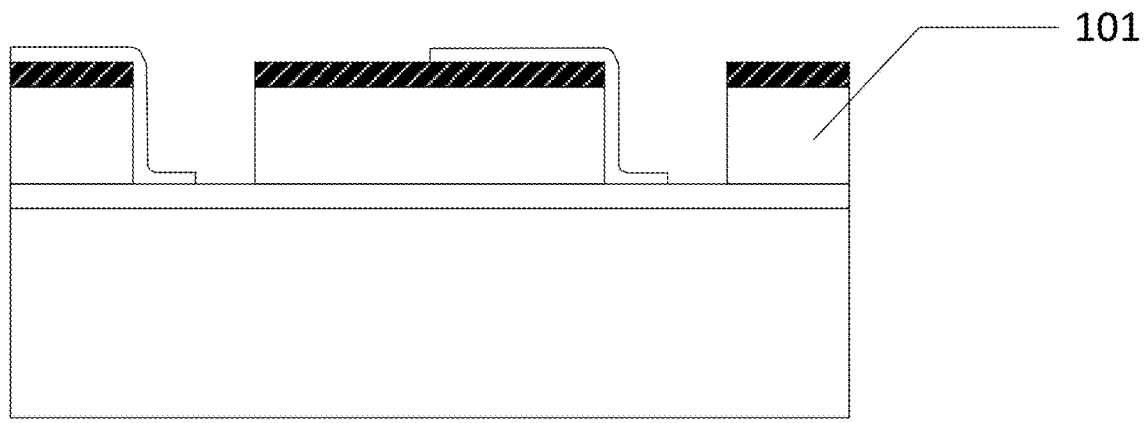
Figure 7H:
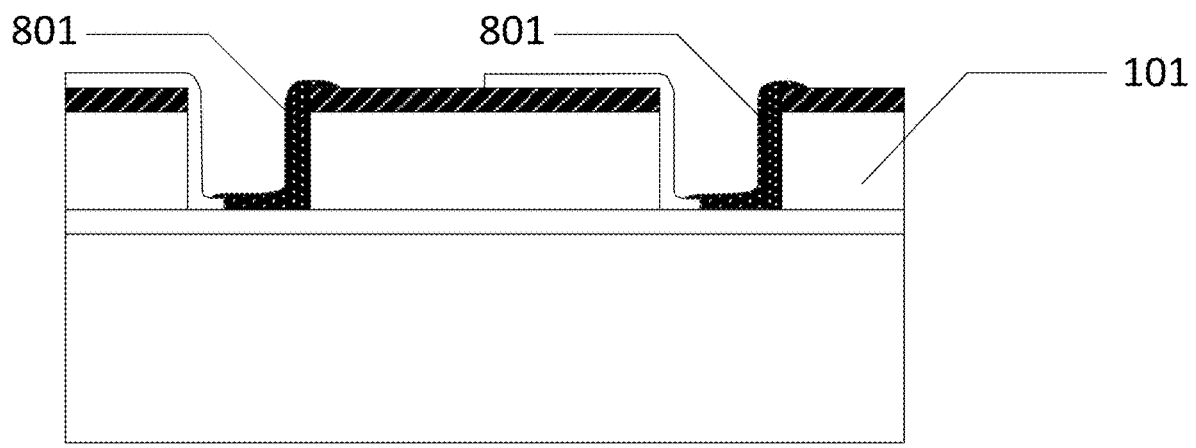
Figure 7I:
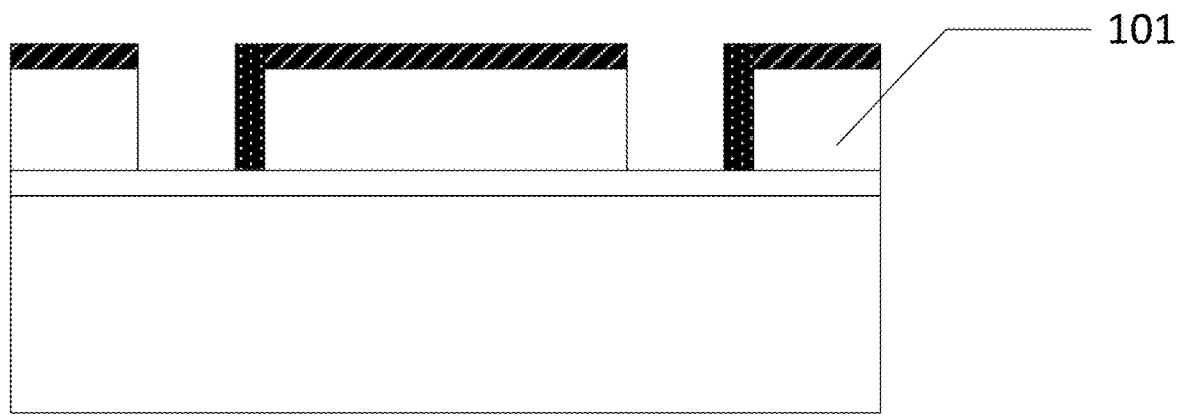
Figure 7J:
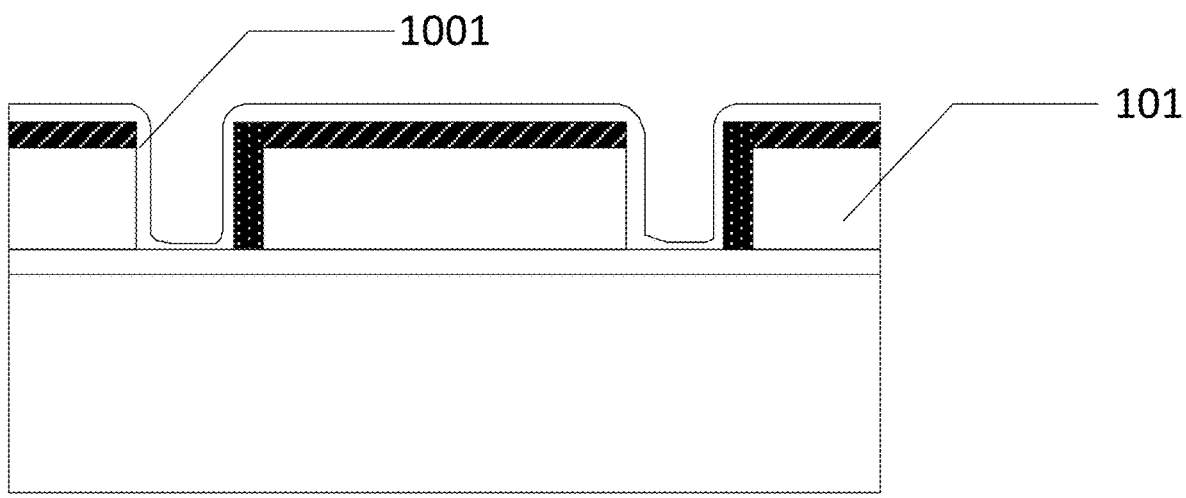
Figure 7K:
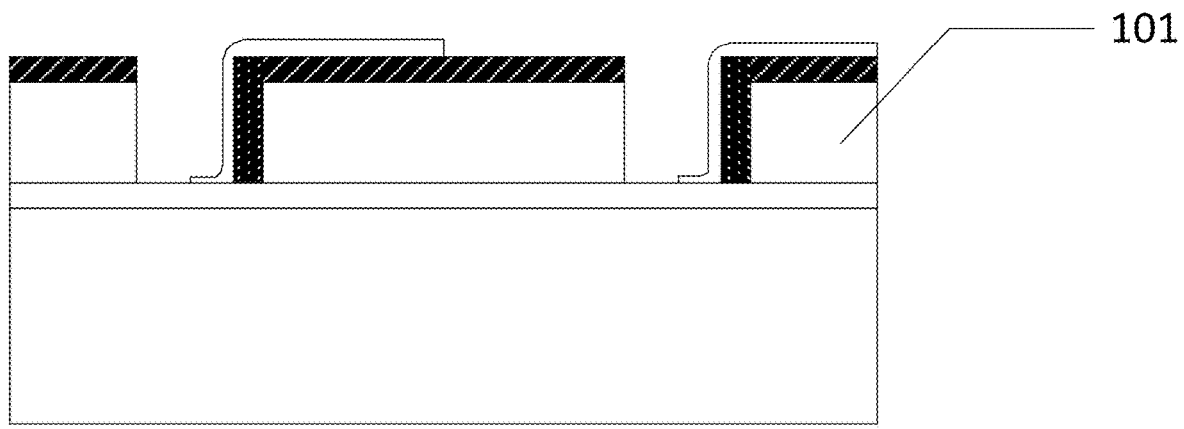
Figure 7L:
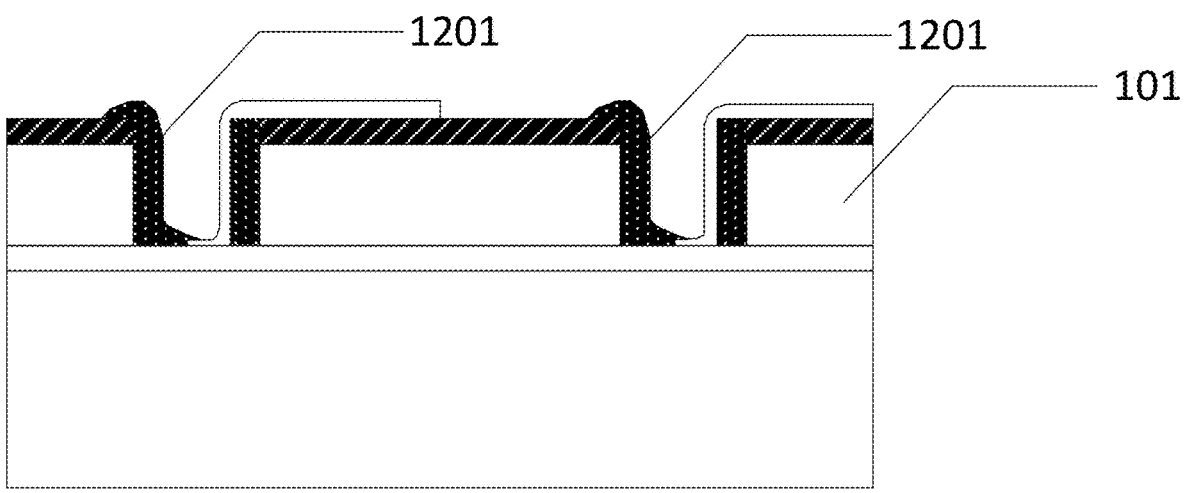
Figure 7M:
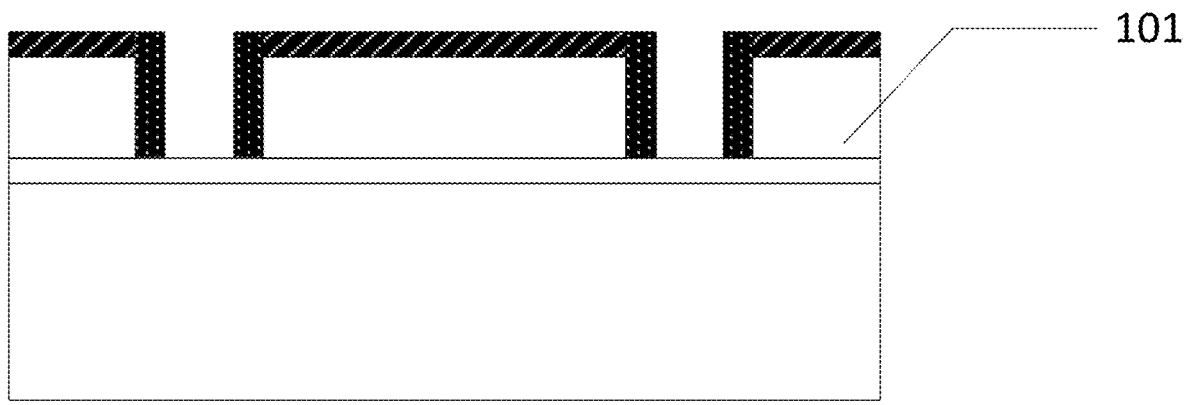
Figure 7N:
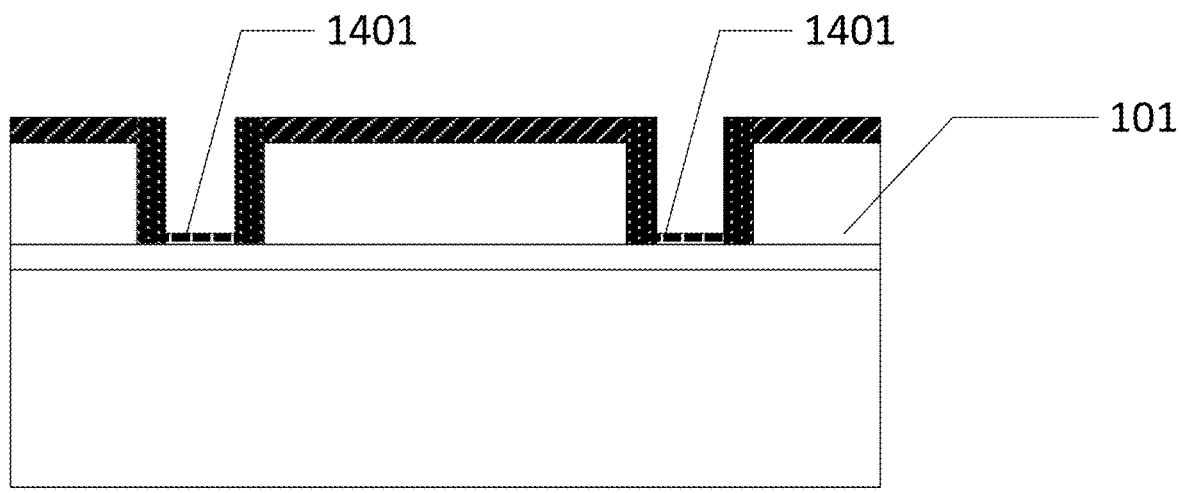
Figure 7O:
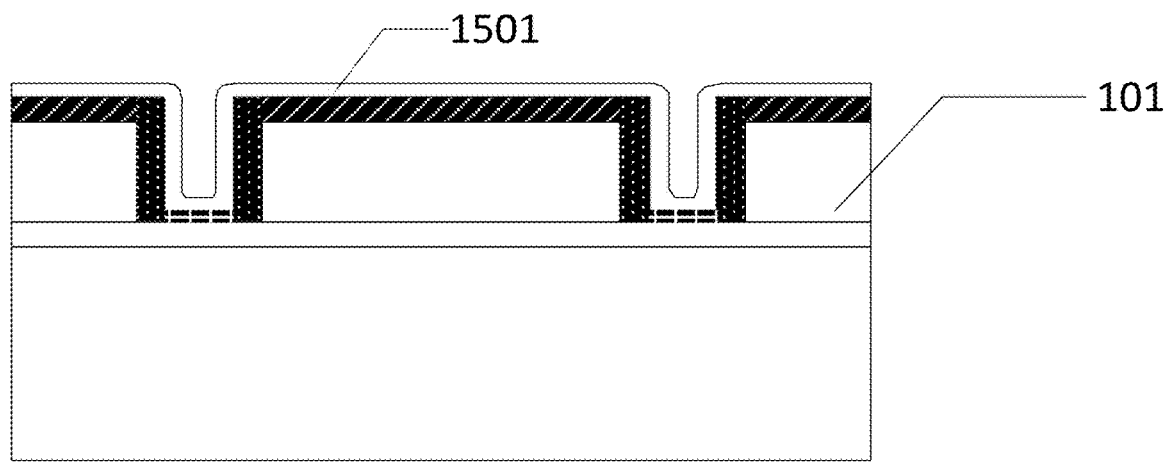
Figure 7P:
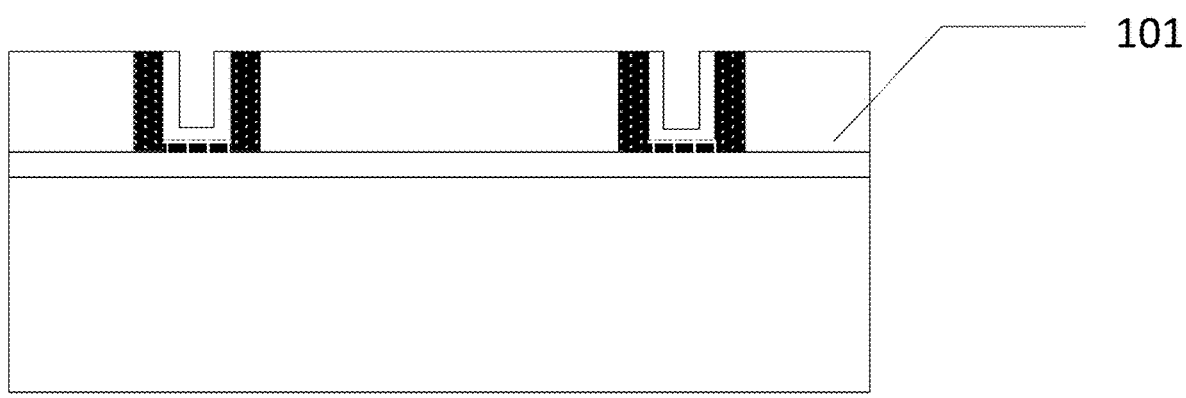
Figure 7Q:
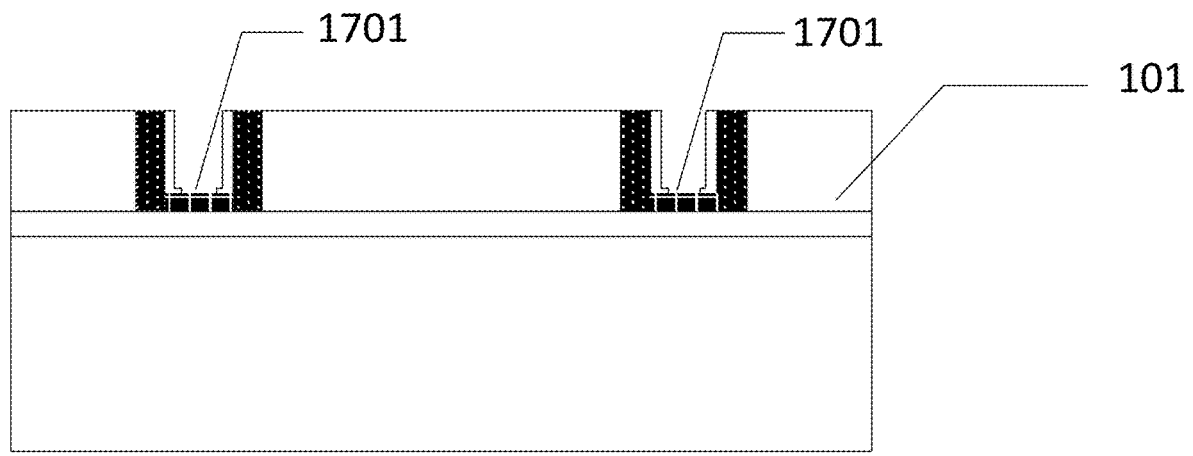
Figure 7R:
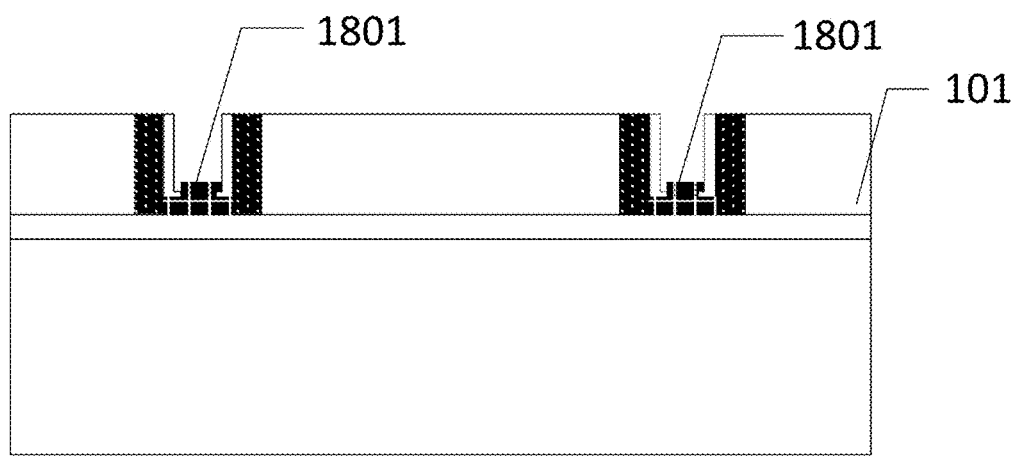
Figure 7S:
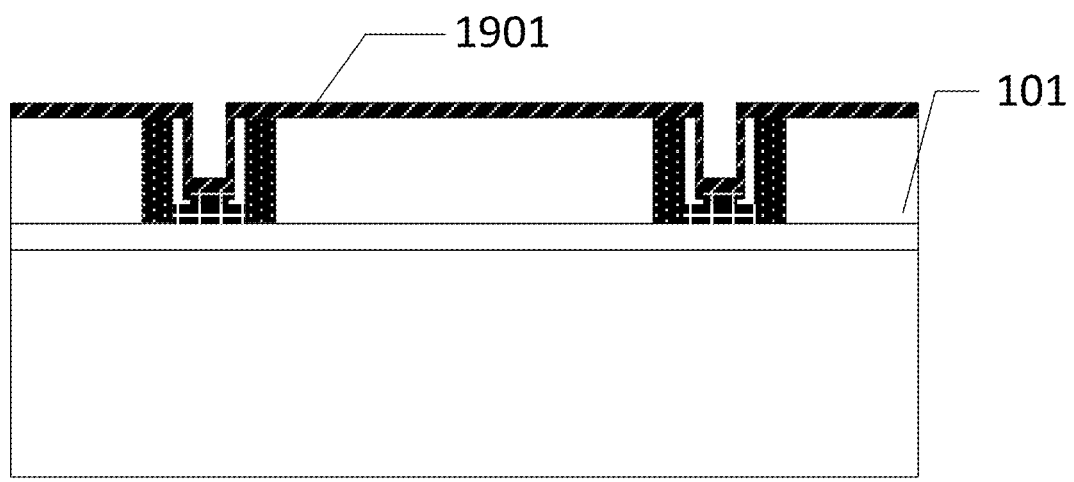

Referring to FIGS. 7A to 7S, FIGS. 7A to 7S are schematic views of another preparation method for a platform-shaped active region based P-I-N diode in a reconfigurable loop antenna according to an embodiment of the disclosure. Based on the above embodiment, the preparation of a platform-shaped active region based P-I-N diode that a length of a solid-state plasma region is 100 micrometers is taken as an example for explanation in detail. The specific steps are as follows.

S10: an SOI substrate is selected.

Referring to FIG. 7A, a crystal orientation of the SOI substrate is (100), the SOI substrate 101 has a doping type of P-type and a doping concentration of $10^{14}$ cm$^{-3}$, and a thickness of a top Si layer for example is 20 μm.

S20: a layer of silicon nitride (SiN) is deposited on a surface of the SOI substrate.

Referring to FIG. 7B, a chemical vapor deposition (CVD) method is adopted to deposit a SiN layer 201 on the SOI substrate 101.

S30: the SOI substrate is etched to form trenches for an active region.

Referring to FIG. 7C-1, a platform-shaped active region pattern is formed on the SiN layer by a photolithography process, the protective layer and the top Si layer are etched in designated positions of the active region pattern by a dry etching process to form a platform-shaped active region 301, and a top view refers to FIG. 7C-2.

S40: the periphery of the platform is flattened/planarized.

Referring to FIG. 7D-1 the peripheral sidewalls of the platform active region is oxidized to make the peripheral sidewalls of the platform active region be formed with an oxide layer 401, and a top view refers to FIG. 7D-2.

Referring to FIG. 7E-1, the oxide layer on the peripheral sidewalls of the platform active region is etched off by a wet etching process to planarize the peripheral sidewalls of the platform active region, and a top view refers to FIG. 7E-2.

S50: a layer of silicon oxide (SiO$_2$) is deposited on a surface of the substrate.

Referring to FIG. 7F, a layer of SO$_2$ 601 is deposited on the substrate by a CVD method.

S60: the SiO$_2$ layer is patterned by photolithography.

Referring to FIG. 7G, a P region pattern is formed on the SiO$_2$ layer by a photolithography process, and the SiO$_2$ layer on the P region pattern is removed by a wet etching process.

S70: a P region is formed.

Referring to FIG. 7H, a specific method includes depositing a P-type Si on the P region pattern on a surface of the SOI substrate to form a P region 801, and a doping concentration of the P region is controlled by controlling a gas flow.

S80: the surface of the substrate is planarized.

Referring to FIG. 7I, a specific method includes planarizing a surface of the P region by a dry etching process, and then removing the SiO$_2$ layer on the surface of the substrate by a wet etching process.

S90: a layer of SiO$_2$ is deposited on the surface of the substrate.

Referring to FIG. 7J, a SiO$_2$ layer is deposited on the surface of the substrate by a CVD method.

S100: the SiO$_2$ layer is patterned by photolithography.

Referring to FIG. 7K, N region pattern is formed on the SiO$_2$ layer by a photolithography process, and the SiO$_2$ layer on the N region is removed by a wet etching process.

S110: an N region is formed.

Referring to FIG. 7L, an N-type Si is deposited on an N region pattern on the surface of the SOI substrate by an in-situ doping method to form an N region 1201, and a doping concentration of the N region is controlled by controlling a gas flow.

S120: the surface of the substrate is planarized.

Referring to FIG. 7M, a surface of the N region is planarized by a dry etching process, and then the SiO$_2$ layer on the surface of the substrate is removed by a wet etching process.

S130: a polysilicon layer is deposited.

Referring to FIG. 7N, a polysilicon layer 1401 is sputtered into the trenches by a CVD method.

S140: a SiO$_2$ layer is formed on the surface.

Referring to FIG. 7O a SiO$_2$ layer 1501 with a thickness of 500 nm is deposited on the surface by a CVD method.

S150: the surface is flattened/planarized.

Referring to FIG. 7P, the SiO$_2$ and SiN layers on the surface are removed by adopting a chemical mechanical polishing (CMP) method, such that the surface is flattened.

S160: impurities are activated.

At 950-1150 degrees Celsius, ion implanted impurities are activated by annealing for 0.5-2 min, and the impurities in the active region are propelled.

S170: lead holes are formed by photolithography.

Referring to FIG. 7Q, the lead holes 1701 are formed by photolithography in the SiO$_2$ layer.

S180: leads are formed.

Referring to FIG. 7R, a metal is sputtered into the surface of the substrate and then is alloyed to form a metal silicide, and the metal on the surface is etched; then a metal 1801 is sputtered onto the surface of the substrate and the leads are formed by photolithography.

S190: a passivation treatment is performed and PADs are formed by photolithography.

Referring to FIG. 7S, a passivation layer 1901 can be formed by depositing SiN and PADs are formed by photolithography. Consequently, the P-I-N diode is formed as a material for preparing the solid-state plasma antenna.

Figure 8:
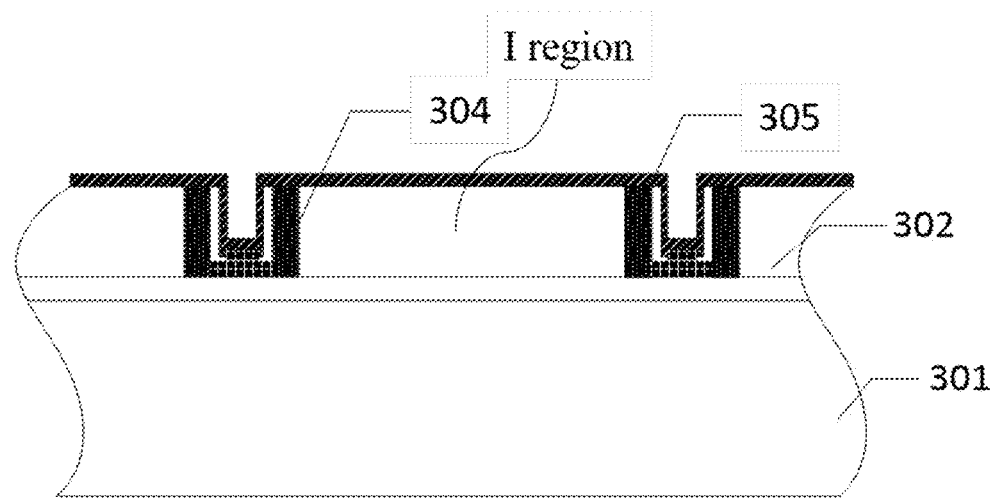
FIG. 8 is a structural schematic view of another platform-shaped active region based P-I-N diode in a reconfigurable loop antenna according to an embodiment of the disclosure.

Referring to FIG. 8, FIG. 8 is a structural schematic view of another platform-shaped active region based P-I-N diode in a reconfigurable loop antenna according to an embodiment of the disclosure. The P-I-N diode is prepared by the preparation method as shown in FIG. 2. Specifically, the P-I-N diode is prepared on an SOI substrate 301, and a P region 304 and an N region 305 of the P-I-N diode and an I region (i.e., intrinsic region) transversely located between the P region 304 and the N region 305 are all located in top Si layer 302 of the SOI substrate.

In summary, specific examples are used herein to describe the principle and implementation manners of the P-I-N diode and its preparation method of the disclosure, and the description of the foregoing embodiments is merely used to help understand the method and core idea of the disclosure. At the same time, for those skilled in the art, according to the idea of the disclosure, some changes may be made in the specific implementations and application ranges. Sum up, the content of the present specification should not be construed as a limitation of disclosure. The protection scope of the disclosure should be covered by the appended claims.

INDUSTRIAL APPLICABILITY

Adverse effects caused by the ion implantation manner can be avoided by adopting the in-situ doping in the embodiments of the disclosure, and the doping concentration of a material can be controlled by controlling a gas flow, and it is favorable for obtaining a steep doping interface, thereby obtaining better device performances. The P-I-N diode plasma reconfigurable antenna may be composed of SOI based PIN diodes arranged in an array, by use of selective conductions of the P-I-N diodes in the array through an external control, the array would form dynamic solid-state plasma stripes and thus achieve the function of antenna and have transmitting and receiving functions for specific electromagnetic waves. Moreover, the antenna can change the solid-state plasma stripes in shape and distribution by use of selective conductions of the P-I-N diodes in the array and thereby realize the reconstruction of antenna, so that has important application prospects in the defense communications and radar technologies.

What is claimed is:

1. A preparation method for a platform-shaped active region based P-I-N diode string in a reconfigurable loop antenna, wherein the P-I-N diode string is configured for manufacturing the reconfigurable loop antenna, and the reconfigurable loop antenna comprises:
   a semiconductor substrate;
   a dielectric plate;
   a first P-I-N diode ring, a second P-I-N diode ring, first direct current (DC) bias wires and second DC bias wires, all disposed on the semiconductor substrate; and
   a coupling type feed source, disposed on the dielectric plate;
   wherein the preparation method comprises steps of:
   (a) selecting a silicon-on-insulator (SOI) substrate;
   (b) etching the SOI substrate to form a platform-shaped active region;
   (c) depositing a P-type silicon material and an N-type silicon material around the platform-shaped active region by an in-situ doping process to form a P region and an N region respectively, wherein an I region transversely located between the P region and the N region is formed in a top silicon layer of the SOI substrate;
   (d) depositing a polysilicon material around the platform-shaped active region by a chemical vapor deposition (CVD) process;
   (e) depositing a fourth protective layer on a surface of the SOI substrate by a CVD process;
   (f) activating impurities in the P region and N region by an annealing process; and
   (g) forming leads on a surface of the polysilicon material and forming PADs by photolithography, to obtain the P-I-N diode string.

2. The preparation method according to claim 1, wherein the step (b) comprises:
   (b1) forming a first protective layer on a surface of the SOI substrate by a CVD process;
   (b2) forming an active region pattern on the first protective layer by a photolithography process using a first mask;
   (b3) etching the first protective layer and the top silicon layer of the SOI substrate in designated positions around the active region pattern by a dry etching process.

3. The preparation method according to claim 1, after the step (b), further comprising:
   (x1) oxidizing sidewalls of the platform-shaped active region by an oxidizing process to form an oxide layer on the sidewalls of the platform-shaped active region; and
   (x2) etching off the oxide layer by a wet etching process to planarize the sidewalls of the platform-shaped active region.

4. The preparation method according to claim 1, wherein the step (c) comprises:
   (c1) depositing a second protective layer on a surface of the SOI substrate;
   (c2) forming a P region pattern on a surface of the second protective layer by a photolithography process using a second mask;
   (c3) removing the second protective layer on the P region pattern by a wet etching process;
   (c4) depositing the P-type silicon material on a sidewall of the platform-shaped active region to form the P region by the in-situ doping process;
   (c5) depositing a third protective layer on a surface of the SOI substrate;
   (c6) forming an N region pattern on a surface of the third protective layer by a photolithography process using a third mask;
   (c7) removing the third protective layer on the N region pattern by a wet etching process; and
   (c8) depositing the N-type silicon material on another sidewall of the platform-shaped active region to form the N region by the in-situ doping process.

5. The preparation method according to claim 4, wherein the step (c4) comprises:
   (c41) depositing the P-type silicon material on the sidewall of the platform-shaped active region by the in-situ doping process;
   (c42) etching the P-type silicon material by a dry etching process using a fourth mask to form the P region on the sidewall of the platform-shaped active region; and
   (c43) removing the second protective layer on the surface of the SOI substrate by a selective etching process.

6. The preparation method according to claim 4, wherein the step (c8) comprises:
   (c81) depositing the N-type Si material on the another sidewall of the platform-shaped active region by the in-situ doping process;
   (c82) etching the N-type silicon material by a dry etching process using a fifth mask to form the N region on the another sidewall of the platform-shaped active region; and
   (c83) removing the third protective layer on the surface of the SOI substrate by a selective etching process.

7. The preparation method according to claim 1, wherein the step (g) comprises:
   (g1) forming a lead hole pattern on a surface of the fourth protective layer by a photolithography process using a sixth mask;
   (g2) etching the fourth protective layer to expose a part of the polysilicon material by an anisotropic etching process to form the lead holes;
   (g3) sputtering a metal material into the lead holes to form a metal silicide; and
   (g4) performing a passivation treatment, forming PADs by photolithography and performing an interconnection, to obtain the P-I-N diode string.

8. The preparation method according to claim 1, wherein the first plasma P-I-N diode ring comprises a first plasma P-I-N diode string, the second plasma P-I-N diode ring comprises a second plasma P-I-N diode string, and a perimeter of each of the first plasma P-I-N diode ring and the second plasma P-I-N diode ring is equal to an electromagnetic wavelength of a signal to be received.

9. The preparation method according to claim 8, wherein the first DC bias wires are disposed on two ends of the first plasma P-I-N diode string, the second DC bias wires are disposed on two ends of the second plasma P-I-N diode string, and the first DC bias wires and the second DC bias wires are formed on the semiconductor substrate by a heavily doped polysilicon.

10. The preparation method according to claim 1, wherein the coupling type feed source is mounted on the dielectric plate; the dielectric plate is provided with a metal microstrip patch on an upper surface and a metal grounding plate on a lower surface; and the metal microstrip patch comprises a main branch, first sub-branches and second sub-branches.

* * * * *